United States Patent [19]

Blackham

[11] Patent Number: 5,748,000
[45] Date of Patent: May 5, 1998

[54] ERROR CORRECTION METHOD FOR TRANSMISSION MEASUREMENTS IN VECTOR NETWORK ANALYZERS

[75] Inventor: David Vernon Blackham, Santa Rosa, Calif.

[73] Assignee: Hewlett-Packard Company, Palo Alto, Calif.

[21] Appl. No.: 691,062

[22] Filed: Aug. 1, 1996

[51] Int. Cl.$^6$ .................................................. G01R 27/04
[52] U.S. Cl. ........................................ 324/601; 324/638
[58] Field of Search ................................. 324/601, 638

[56] References Cited

U.S. PATENT DOCUMENTS

| 4,816,767 | 3/1989 | Cannon | 324/601 |
| 4,845,423 | 7/1989 | Pollard | 324/601 |

OTHER PUBLICATIONS

Ferrero et al; "Two–Port Network Analyzer Calibration Using an Unknown TRU." IEEE MW Letters—Dec. 1992.
Franzen et al; "A New Procedure for System Calibration . . . " 5th European Microwave Conference—Sep. 1975.

Primary Examiner—Ernest F. Karlsen
Assistant Examiner—Jose M. Solis
Attorney, Agent, or Firm—John L. Imperato

[57] ABSTRACT

An error correction method reduces transmission measurement errors and improves measurement accuracy of vector network analyzers. A reflection measurement made using a thruline standard connected between a source port and load port of a transmission/reflection (T/R) test set characterizes the impedance match of the load port while a reflection calibration characterizes the source port. The source port characterization and the load port characterization are then processed to correct a transmission tracking error in subsequent transmission measurements made on a device under test (DUT), without impacting the measurement speed of the VNA. A reflection measurement made with the DUT connected between the source and load port provides a measurement of the DUT's input reflection coefficient, including the effect of the impedance mismatch of the load port. This reflection measurement and the source port characterization are processed to correct a DUT input mismatch error. Correction of the transmission tracking error or the DUT input mismatch error improves the accuracy of transmission measurements made by the VNA.

7 Claims, 3 Drawing Sheets

ERROR CORRECTION METHOD FOR TRANSMISSION MEASUREMENTS IN VECTOR NETWORK ANALYZERS

FIELD OF THE INVENTION

The present invention relates to vector network analyzers and, more particularly, to a method for correcting errors in transmission measurements caused by impedance mismatches in a vector network analyzer's test set.

BACKGROUND OF THE INVENTION

Vector network analyzers (VNAs) incorporating high frequency transmission/reflection (T/R) test sets are used to determine the transmission and reflection characteristics of various devices under test (DUTs). The measurement accuracy of a VNA generally improves as the impedances of a source port and a load port of the T/R test set more closely match a predetermined characteristic impedance. Unfortunately, limitations of the electronic hardware used within the T/R test set cause impedance mismatches at the source and load ports that increase measurement uncertainty and degrade measurement accuracy. One transmission measurement error originates during transmission calibration when a thruline standard is connected between the source port and load port. Impedance mismatches between the source and load ports generate a transmission tracking error that effects subsequent transmission measurements made by the VNA. Another transmission measurement error originates when the DUT is connected between the source and load ports of the T/R test set. Impedance mismatches between the source port and the DUT generate a DUT input mismatch error.

A known method for reducing transmission measurement errors in a VNA relies on a full two port characterization of the DUT, including both forward and reverse transmission and reflection measurements. Based on this two port characterization, a variety of known vector error correction techniques may be used to mathematically correct for the transmission measurement errors. However, in order to apply the known vector error correction techniques when using a T/R test set, the connection ports of the DUT must be physically reversed relative to the source and load ports to acquire the full two port characterization of the DUT. Reversing the connection ports is time consuming and perturbs the operation of the DUT, especially for DUTs including sensitive circuitry such as integrated circuits or wafer probe systems. In an effort to reduce measurement time and reduce perturbations to the DUT, transmission measurement errors due to impedance mismatches are not corrected and the measurement accuracy of the VNA is sacrificed.

SUMMARY OF THE INVENTION

In accordance with the preferred embodiment of the present invention, an error correction method reduces transmission measurement errors and improves measurement accuracy of vector network analyzers. Transmission tracking errors and device under test (DUT) input mismatch errors caused by impedance mismatches are reduced. A reflection measurement made using a thruline standard connected between a source port and load port of a T/R test set characterizes the impedance match of the load port, while a reflection calibration using reflection standards and known calibration techniques characterizes the source port. The source port characterization and the load port characterization are then processed to correct the transmission tracking error. This correction is applied to subsequent transmission measurements of a DUT without impacting the measurement speed of the VNA. Then, a reflection measurement made with the DUT connected between the source and load ports provides a measurement of the DUT's input reflection coefficient, including the effect of the impedance mismatch of the load port. This reflection measurement and the source port characterization are then processed to correct the DUT input mismatch error. Correction of the transmission tracking error or the DUT input mismatch error improves the accuracy of transmission measurements made by the VNA.

DETAILED DESCRIPTION OF THE PREFERRED EMBODIMENT

Figure 1:
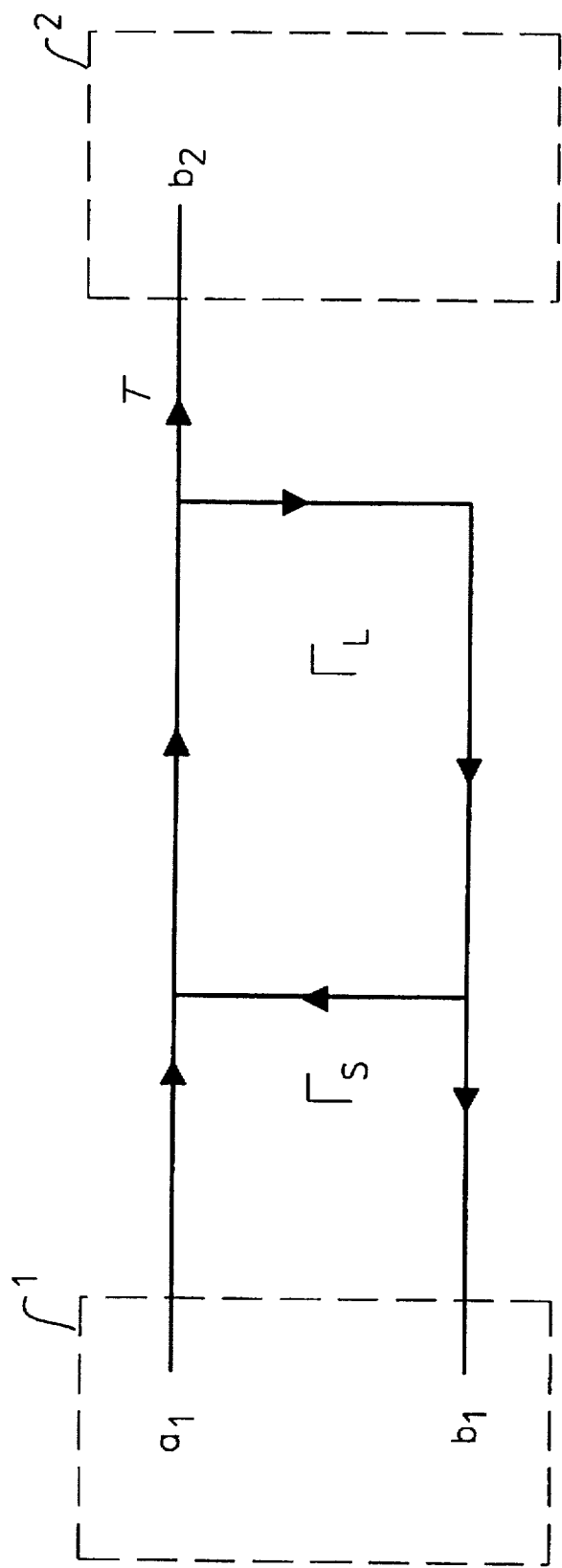
FIG. 1 shows a flowgraph of a T/R test set used in accordance with the preferred embodiment of the present invention.

FIG. 1 shows a flowgraph of a transmission/reflection (T/R) test set used in accordance with the preferred embodiment of the present invention to assess a transmission tracking error during transmission calibration of the T/R test set. When used in conjunction with a vector network analyzer (VNA), the T/R test set enables the VNA to perform vector measurements, including magnitude and phase measurement of a DUT's forward transmission coefficient $S_{21}$ and reflection coefficient $S_{11}$. A source port 1 transmits signals $a_1$ and receives signals $b_1$, and a load port 2 receives signals $b_2$ in the VNA's T/R test set. During transmission calibration of the VNA a thruline standard is connected between the source port 1 and the load port 2 of the T/R test set. Impedance mismatches at the source port 1 and the load port 2 form a source reflection coefficient $\Gamma_S$ and a load reflection coefficient $\Gamma_L$ introducing measurement uncertainty in the transmission calibration. This measurement uncertainty, if not reduced, degrades the accuracy of subsequent transmission measurements made by the VNA. A measured transmission tracking $\hat{T}$ differs from an actual transmission tracking T of the thruline standard by a transmission tracking error $E_T$. This relationship is determined from the flowgraph of FIG. 1 as:

$$T = \frac{b_2}{a_1} \|_{THRULINE} = \frac{t}{(1 - \Gamma_S \Gamma_L)} = T^* E_T$$

where the transmission tracking error $$E_T = \frac{1}{1 - \Gamma_S \Gamma_L}.$$

Use of signal flowgraphs is described in publications such as Hewlett-Packard Company's Application Note AN-154, *S-Parameter Design*, published in April 1972.

Figure 2:
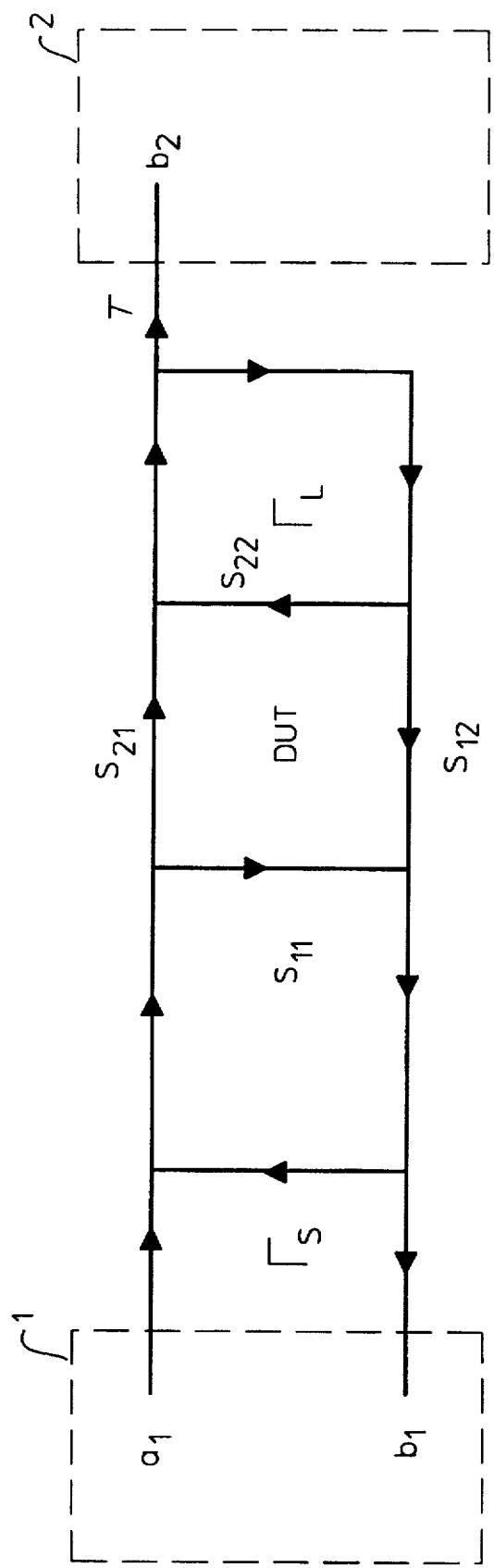
FIG. 2 shows a flowgraph of the T/R test set, including a device under test, used in accordance with the preferred embodiment of the present invention.

FIG. 2 shows a flowgraph of the T/R test set, including a DUT, used in accordance with the preferred embodiment of the present invention to assess a measured transmission coefficient $\hat{S}_{21}$ of the DUT. The measured transmission coefficient $\hat{S}_{21}$ is a function of the S-parameters, $S_{11}$, $S_{22}$, $S_{21}$ and $S_{12}$, of the DUT, as well as the source reflection coefficient $\Gamma_S$, the load reflection coefficient $\Gamma_L$ and the actual transmission tracking T. The measured transmission coefficient $\hat{S}_{21}$ is derived from the flowgraph of FIG. 2 as:

$$\hat{S}_{21} = \frac{b_2}{a_1} = \frac{S_{21}T}{(1-\Gamma_S S_{11} - \Gamma_L S_{22} - \Gamma_S \Gamma_L S_{21} S_{12} + \Gamma_S \Gamma_L S_{11} S_{22})} \quad (2)$$

$$= \frac{S_{21}T}{\left(1-\Gamma_S\left(S_{11}+\frac{\Gamma_L S_{11} S_{12}}{1-\Gamma_L S_{22}}\right)-\Gamma_L S_{22}+\Gamma_L \Gamma_L S_{22}\left(S_{11}+\frac{\Gamma_L S_{21} S_{12}}{(1-\Gamma_L S_{22})}\right)\right)}$$

A measured DUT input reflection coefficient $\Gamma\epsilon$ includes the effect of the impedance mismatch of the load port 2 of the T/R test set and is expressed as:

$$\Gamma_\epsilon = \frac{b_1}{a_1}\bigg|_{\Gamma_L \neq 0} = S_{11} + \frac{S_{21}S_{12}\Gamma_L}{1-S_{22}\Gamma_L}$$

Substituting $\Gamma\epsilon$ into equation (2) yields the expression for the measured transmission coefficients $\hat{S}_{21}$ as:

$$\hat{S}_{21} = \frac{S_{21}T}{(1-\Gamma_L S_{22})(1-\Gamma_S \Gamma_\epsilon)}$$

A corrected transmission coefficient $\tilde{S}_{21}$ is obtained by dividing the measured transmission coefficient $\hat{S}_{21}$ by the measured transmission tracking $\hat{T}$ as:

$$\tilde{S}_{21} = \frac{\hat{S}_{21}}{\hat{T}} \equiv \frac{S_{21}(1-\Gamma_S \Gamma_L)}{(1-\Gamma_L S_{22})(1-\Gamma_S \Gamma_\epsilon)} = \frac{S_{21}}{E_{DO}E_{DI}E_T} \quad (3)$$

where the DUT input mismatch error $E_{DI}=1-\Gamma_S\Gamma_\epsilon$ and the DUT output mismatch error $E_{DO}=1-\Gamma_L S_{22}$ and where $E_T$ is the previously defined transmission tracking error. Thus, the measurement accuracy of the DUT forward transmission coefficient $S_{21}$ is degraded by the DUT input mismatch error $E_{DI}$, the DUT output mismatch error $E_{DO}$ and the transmission tracking error $E_T$. Since the DUT output reflection coefficient $S_{22}$ is not measured using the T/R test set to avoid having to reverse the connections of the DUT relative to the source port 1 and load port 2, the DUT output mismatch error $E_{DO}$ is not addressed.

Reductions of both the DUT input mismatch error $E_{DI}$ and the transmission tracking error $E_T$ are achieved by applying an error correction factor to the corrected transmission coefficient $\tilde{S}_{21}$ in accordance with the preferred embodiment of the present invention. The impedance mismatches of the source port 1 and the load port 2 are characterized during calibration using the thruline standard and one or more reflection standards, such as an open, short or load standard. The effects of the source reflection coefficient $\Gamma_S$ and the load reflection coefficient $\Gamma_L$ on the DUT forward transmission coefficient $S_{21}$ is then reduced. While the DUT input mismatch error $E_{DI}$ is DUT dependent and varies according to the impedance match of the DUT, the transmission tracking error $E_T$ results from the transmission calibration and is independent of the DUT. Thus, corrections made to reduce the transmission tracking error $E_T$ are applied to transmission measurements subsequent to the transmission calibration, without decreasing the measurement speed of the VNA.

A measured source reflection coefficient $\hat{\Gamma}_S$ is obtained at the source port 1 of the T/R test set during the one port reflection calibration when one or more reflection standards such as an open, short and load are connected to the source port 1. A measured load reflection coefficient $\hat{\Gamma}_L$ is obtained from a reflection measurement made when a thruline standard is connected between the source port 1 and the load port 2. The measured load and source reflection coefficients $\hat{\Gamma}_L$, $\hat{\Gamma}_S$ are applied to equation 3 to reduce the transmission tracking error $E_T$ so that the effects of the residual source reflection coefficient $\Delta\Gamma_S$ and residual load reflection coefficient $\Delta\Gamma_L$ dominate the transmission tracking error $E_T$. Residual errors are attributable to the limited accuracy with which the thruline standard and the reflection standards are known. The measured source reflection coefficient $\hat{\Gamma}_S$ and the measured load reflection coefficient $\hat{\Gamma}_L$ are related to the actual source and load reflection coefficients $\Gamma_S$, $\Gamma_L$ as:

$$\hat{\Gamma}_S = \Gamma_S + \Delta\Gamma_S$$

$$\hat{\Gamma}_L = \Gamma_L + \Delta\Gamma_L$$

The transmission tracking error $E_T$ is then estimated from the measured source and load reflection coefficients, $\hat{\Gamma}_S$ and $\hat{\Gamma}_L$, as:

$$E_T \equiv \frac{1}{1-\hat{\Gamma}_S\hat{\Gamma}_L} = \frac{1}{(1-(\Gamma_S + \Delta\Gamma_S)(\Gamma_L + \Delta\Gamma_L))}$$

Using the approximation that the product $\Delta\Gamma_S\Delta\Gamma_L$ is negligible, $$\frac{1}{1-\hat{\Gamma}_S\hat{\Gamma}_L} \cong \frac{1}{(1-\Gamma_S\Gamma_L)} \cdot \frac{1}{(1-\Delta\Gamma_S\Gamma_L - \Gamma_L\Delta\Gamma_S))}$$

Thus, the estimated tracking error, $$\frac{1}{1-\hat{\Gamma}_S\hat{\Gamma}_L}$$

has a residual tracking error, $$\frac{1}{(1-\Delta\Gamma_S\Gamma_L - \Gamma_L\Delta\Gamma_S))} \cdot$$

A measured input reflection coefficient $\hat{\Gamma}_\epsilon$, including the effect of the impedance of the load port 2, is obtained by measuring the input reflection coefficient with the DUT connected to the source port 1 and the load port 2. A residual measurement uncertainty $\Delta\Gamma\epsilon$ in the input reflection coefficient depends on residual errors associated with the reflection measurement and is related to the actual input coefficient $\Gamma\epsilon$ as:

$$\hat{\Gamma}_\epsilon = \Gamma_\epsilon + \Delta\Gamma_\epsilon$$

Thus, the DUT input mismatch error $E_{DI}$ is estimated from the measured source reflection coefficient $\hat{\Gamma}_S$ and the measured input reflection coefficient $\hat{\Gamma}_\epsilon$ as:

$$E_{DI} = 1 - \hat{\Gamma}_S\hat{\Gamma}_\epsilon = (1-(\Gamma_S + \Delta\Gamma_S)(\Theta_\epsilon + \Delta\Gamma_\epsilon))$$

Using the approximation that the product $\Delta\Gamma_S\Delta\Gamma\epsilon$ is negligible, $$1-\hat{\Gamma}_S\hat{\Gamma}_\epsilon \cong (1-\Gamma_S\Gamma_\epsilon)(1-\Delta\Gamma_S\Gamma_\epsilon-\Delta_\epsilon\Gamma_S))$$

where the term $(1-\Delta\Gamma_S\Gamma_\epsilon-\Delta\Gamma_\epsilon\Gamma_S)$ is the DUT residual input mismatch error.

The error terms $E_{DI}$ and $E_T$ in equation 3 are reduced by an error correction factor $E_C$ based on the measured source reflection coefficient $\hat{\Gamma}_S$, the measured load reflection coefficient $\hat{\Gamma}_L$ and the measured DUT input reflection coefficient $\hat{\Gamma}_\epsilon$. This error correction factor $$E_C = \frac{(1-\hat{\Gamma}_S\hat{\Gamma}_\epsilon)}{(1-\hat{\Gamma}_S\hat{\Gamma}_L)} \tag{?}$$

is applied to the corrected transmission coefficient in equation 3 to improve measurement accuracy as:

$$\tilde{S}_{21} = \frac{\hat{S}_{21}}{\hat{T}} E_C = \tag{4}$$

$$\frac{\hat{S}_{21}}{\hat{T}} \cdot \frac{(1-\hat{\Gamma}_S\hat{\Gamma}_\epsilon)}{(1-\hat{\Gamma}_S\hat{\Gamma}_L)} \cong \frac{S_{21}(1-\Delta\Gamma_S\Gamma_\epsilon-\Delta\Gamma_\epsilon\Gamma_S)}{(1-\Gamma_L S_{22})(1-\Delta\Gamma_S\Gamma_L-\Delta\Gamma_L\Gamma_S)}.$$

The DUT residual input mismatch error and the residual tracking error are significantly smaller than the transmission tracking error $E_T$ and the DUT input mismatch error $E_{DI}$, causing the corrected transmission coefficient $\tilde{S}_{21}$ in equation 4 to accurately represent the actual DUT forward transmission coefficient $S_{21}$. Multiplication of equation 3 by the error correction factor $E_C$ reduces the transmission tracking error $E_T$ and the DUT input mismatch error $E_{DI}$ to the level of residual error terms, limit by the accuracy to which the thruline standard and the reflection standards are known.

Although the error correction factor $E_C$ includes correction for both the transmission tracking error $E_T$ and the DUT input mismatch error $E_{DI}$ either a transmission tracking correction factor $$E_{TC} = \frac{1}{1-\hat{\Gamma}_S\hat{\Gamma}_L} \tag{5}$$

or a DUT input mismatch correction $$E_{DIC} = 1-\hat{\Gamma}_S\hat{\Gamma}_\epsilon \tag{6}$$

may be applied separately to correct the measured transmission coefficient $\tilde{S}_{21}$ of the DUT as expressed in equation 3. When correction according to the transmission tracking correction factor $E_{TC}$ or the DUT input mismatch correction $E_{DIC}$ are applied independently, the measurement accuracy of the DUT forward transmission coefficient $S_{21}$ by the VNA is improved. When the transmission tracking correction factor $E_{TC}$ is applied to equation 3, the transmission tracking error $E_T$ is reduced. When the DUT input mismatch correction $E_{DIC}$ is applied to equation 3, the DUT input mismatch error is reduced. However, the measurement accuracy of the VNA is most improved when the error correction factor $E_C$, which incorporates both the transmission tracking correction factor $E_{TC}$ and DUT input mismatch correction $E_{DIC}$ is applied to correct the DUT forward transmission coefficient $S_{21}$.

Figure 3:
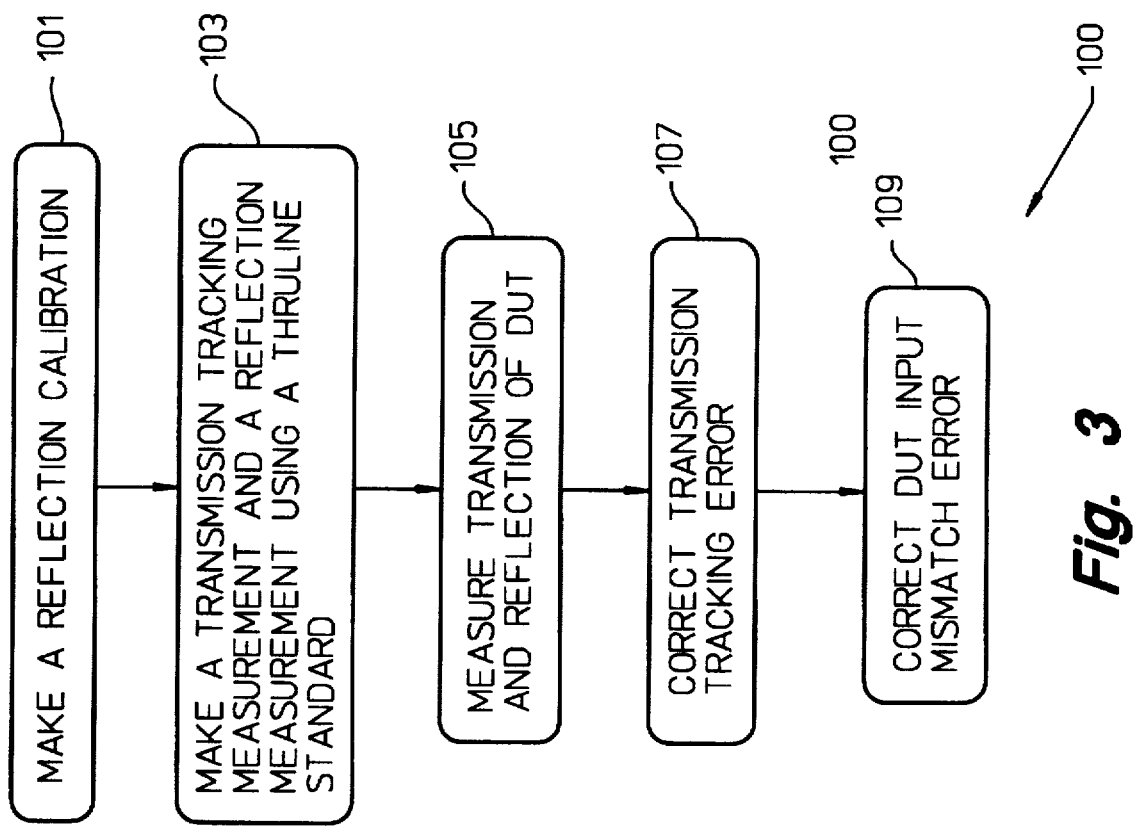
FIG. 3 shows a flow diagram of the method for correcting transmission measurement errors in accordance with the preferred embodiment of the present invention.

FIG. 3 shows a flow diagram 100 of the error correction method in accordance with the preferred embodiment of the present invention. In step 101 a reflection calibration is made using one or more reflection standards connected to the source port 1, to characterize the source reflection coefficient $\hat{\Gamma}_S$ and to provide accurate reflection measurements subsequently made using the T/R test set. In step 103 the transmission tracking measurement and the reflection measurement are made with a thruline standard connected between the source port 1 and the load port 2 of the T/R test set, to yield the measured transmission tracking $\hat{T}$ and the load reflection coefficient $\hat{\Gamma}_L$, respectively. In step 105 the reflection measurement and the transmission measurement are made with the DUT connected between the source port 1 and the load port 2, to yield an input reflection coefficient $\hat{\Gamma}_\epsilon$ and a measured forward transmission coefficient $\hat{S}_{21}$, respectively. In step 107 the transmission tracking correction factor $E_{TC}$ is computed and applied according to reduce transmission tracking error $E_T$ in the measurement of the DUT forward transmission coefficient $S_{21}$. This increases the accuracy of transmission measurements without decreasing the measurement speed of the VNA. In step 109 the DUT input mismatch correction $E_{DIC}$ is computed according to the source reflection coefficient $\hat{\Gamma}_S$ and the input reflection coefficient $\hat{\Gamma}_\epsilon$, and is applied to reduce the DUT input mismatch error $E_{DI}$ in the measured transmission coefficient $\hat{S}_{21}$. The correction of steps 107 and 109 includes division of the measured transmission coefficient $\hat{S}_{21}$ by the measured transmission tracking $\hat{T}$ and application of the transmission tracking correction factor $E_{TC}$ and the DUT input mismatch correction $E_{DIC}$ to the measured transmission coefficient $\hat{S}_{21}$ to yield the corrected transmission coefficient $\tilde{S}_{21}$ according to equation 4. In an effort to improve measurement speed of a VNA, the reflection measurement made in step 105 and the correction of the DUT input mismatch error $E_{DI}$ made in step 109 may be eliminated. However, both the transmission tracking error $E_T$ and the DUT input mismatch error $E_{DI}$ are reduced to the level of residual errors when steps 101–109 of the flow diagram 100 are implemented.

An error correction method reduces the effects of impedance mismatches in a T/R test set and improves the accuracy of transmission measurements made by vector network analyzers. Transmission tracking error and DUT input mismatch error in DUT transmission measurements are reduced to the level at which residual errors become dominant. The error correction method may be implemented in software, internal or external to the VNA and T/R test set, or the error correction method may be implemented in the VNA's internal firmware. Although the error correction method as shown is applied to a T/R test set, the error correction method may be applied to other types of test sets, such as two port test sets, if correction of transmission measurements is desired, without the added measurement time consumed by a full two port characterization of the DUT.

What is claimed is:

1. A method for correcting transmission measurements of a device under test in a vector network analyzer having a source port and a load port, the method comprising the steps of:

measuring a source reflection coefficient based on at least one reflection standard connected to the source port;

measuring transmission tracking when a thruline standard is connected between the source port and the load port;

measuring a load reflection coefficient when the thruline standard is connected between the source port and the load port;

measuring a transmission coefficient when the device under test is connected between the source port and the load port; and correcting the measured transmission coefficient according to the measured transmission tracking, the measured load reflection coefficient and the measured source reflection coefficient.

2. The method of claim 1 wherein the step of correcting the measured transmission coefficient includes dividing the measured transmission coefficient by the measured transmission tracking and by one minus the product of the source measured reflection coefficient and the measured load reflection coefficient.

3. A method for correcting errors in a transmission measurement of a device under test in a vector network analyzer having a source port and a load port, the method comprising the steps of:

measuring a source reflection coefficient based on at least one reflection standard connected to the source port;

measuring an input reflection coefficient when the DUT is connected between the source port and the load port;

measuring a transmission coefficient when the DUT is connected between the source port and the load port; and correcting the measured transmission coefficient according to the measured source reflection coefficient and the measured input reflection coefficient.

4. The method of claim 3 wherein the step of correcting the measured transmission coefficient includes the steps of multiplying the measured transmission coefficient by one minus the product of the measured source reflection coefficient and the measured input reflection coefficient.

5. The method of claim 4 further comprising the step of measuring transmission tracking with a thruline standard connected between the source port and the load port and wherein the step of correcting the measured transmission coefficient further includes the step of dividing the measured transmission coefficient by the measured transmission tracking.

6. A method for correcting transmission measurements of a device under test in a vector network analyzer having a source port and a load port, the method comprising the steps of:

measuring a source reflection coefficient based on at least one reflection standard connected to the source port;

measuring transmission tracking when a thruline standard is connected between the source port and load port;

measuring a load reflection coefficient when the thruline standard is connected between the source port and the load port;

measuring an input reflection coefficient when the DUT is connected between the source port and the load port;

measuring a transmission coefficient when the DUT is connected between the source port and the load port; and correcting the measured transmission coefficient by a applying a correction factor dependent upon the transmission tracking, the load reflection coefficient, the source reflection coefficient and the input reflection coefficient.

7. The method of claim 5 wherein the step of correcting the measured transmission coefficient includes the steps of dividing the measured transmission coefficient by the transmission tracking, dividing the measured transmission coefficient by one minus the product of the source reflection coefficient and the load reflection coefficient, and multiplying the measured transmission coefficient by one minus the product of the source reflection coefficient and the input reflection coefficient.

* * * * *

UNITED STATES PATENT AND TRADEMARK OFFICE
CERTIFICATE OF CORRECTION

PATENT NO. : 5,748,000
DATED : May 5, 1998
INVENTOR(S) : David VerNon Blackham

It is certified that error appears in the above-indentified patent and that said Letters Patent is hereby corrected as shown below:

On the title page, item [75]:

Inventor name "David Vernon Blackham" should read -- David VerNon Blackham --.

Signed and Sealed this

Thirtieth Day of November, 1999

Attest:

Q. TODD DICKINSON

*Attesting Officer*    *Acting Commissioner of Patents and Trademarks*